United States Patent
Monteiro Diniz Reis et al.

(10) Patent No.: US 12,414,470 B2
(45) Date of Patent: Sep. 9, 2025

(54) SEMICONDUCTOR COMPONENT INCLUDING A DIELECTRIC LAYER

(71) Applicant: Robert Bosch GmbH, Stuttgart (DE)

(72) Inventors: Daniel Monteiro Diniz Reis, Esslingen Am Neckar (DE); Daniel Pantel, Mundelsheim (DE); Frank Schatz, Kornwestheim (DE); Jochen Tomaschko, Gaeufelden (DE); Mathias Mews, Reutlingen (DE); Timo Schary, Aichtal-Neuenhaus (DE)

(73) Assignee: ROBERT BOSCH GMBH, Stuttgart (DE)

( * ) Notice: Subject to any disclaimer, the term of this patent is extended or adjusted under 35 U.S.C. 154(b) by 920 days.

(21) Appl. No.: 17/614,706

(22) PCT Filed: Jun. 23, 2020

(86) PCT No.: PCT/EP2020/067568
§ 371 (c)(1),
(2) Date: Nov. 29, 2021

(87) PCT Pub. No.: WO2021/004782
PCT Pub. Date: Jan. 14, 2021

(65) Prior Publication Data
US 2022/0238791 A1     Jul. 28, 2022

(30) Foreign Application Priority Data

Jul. 5, 2019 (DE) .................... 10 2019 209 964.5
Jul. 5, 2019 (DE) .................... 10 2019 209 965.3
(Continued)

(51) Int. Cl.
*H10N 30/20* (2023.01)
*H10N 30/00* (2023.01)
(Continued)

(52) U.S. Cl.
CPC ....... *H10N 30/2047* (2023.02); *H10N 30/076* (2023.02); *H10N 30/704* (2024.05); *H10N 30/8554* (2023.02); *H10N 30/87* (2023.02)

(58) Field of Classification Search
CPC ............ H10N 30/2047; H10N 30/076; H10N 30/704; H10N 30/8554; H10N 30/87
See application file for complete search history.

(56) References Cited

U.S. PATENT DOCUMENTS

| | | | |
|---|---|---|---|
| 7,063,813 | B1 | 6/2006 | Nagaya et al. |
| 2010/0079555 | A1 | 4/2010 | Arakawa |

(Continued)

FOREIGN PATENT DOCUMENTS

| | | |
|---|---|---|
| CN | 105957901 A | 9/2016 |
| DE | 112016005244 T5 | 8/2018 |

(Continued)

OTHER PUBLICATIONS

International Search Report for PCT/EP2020/067568, Issued Nov. 5, 2020.

(Continued)

*Primary Examiner* — J. San Martin
(74) *Attorney, Agent, or Firm* — NORTON ROSE FULBRIGHT US LLP

(57) ABSTRACT

A semiconductor component that includes at least one dielectric layer and at least one first electrode and one second electrode. A first defect type and a second defect type, which is different from the first defect type, are also present in dielectric layer. The at least two different defect types accumulate at one of the two electrodes as a function of a main operating voltage applied between the first electrode and the second electrode, and of a main operating temperature that is present at characteristic times $\tau_1$ and $\tau_2$, and generate the maximum changes in barrier height $\delta\Phi_1$ (Continued)

and $\delta\Phi_2$ at the electrodes. $\tau_1$ and $\delta\Phi_1$ are associated with the first defect type, and $\tau_2$ and $\delta\Phi_2$ are associated with the second defect type. $\tau_1<\tau_2$ and $\delta\Phi_1<\delta\Phi_2$ apply.

8 Claims, 6 Drawing Sheets

(30) Foreign Application Priority Data

Jul. 8, 2019 (DE) ...................... 10 2019 210 032.5
Jul. 8, 2019 (DE) ...................... 10 2019 210 033.3

(51) Int. Cl.
*H10N 30/076* (2023.01)
*H10N 30/853* (2023.01)
*H10N 30/87* (2023.01)

(56) References Cited

U.S. PATENT DOCUMENTS

| | | |
|---|---|---|
| 2011/0074889 A1 | 3/2011 | Hara |
| 2014/0151626 A1 | 6/2014 | Phatak |
| 2018/0170044 A1 | 6/2018 | Mawatari |
| 2022/0216298 A1* | 7/2022 | Monteiro Diniz Reis ................ H10D 1/682 |
| 2023/0402412 A1* | 12/2023 | Monteiro Diniz Reis ................ H01L 24/03 |
| 2024/0019482 A1* | 1/2024 | Monteiro Diniz Reis ................ G01R 31/52 |

FOREIGN PATENT DOCUMENTS

| | | |
|---|---|---|
| EP | 3306687 A1 | 4/2018 |
| JP | 2004259892 A | 9/2004 |
| JP | 2006096647 A | 4/2006 |
| JP | 2008261061 A | 10/2008 |
| JP | 2020012159 A | 1/2020 |

OTHER PUBLICATIONS

Chakraborti et al., "XPS Depth Profiling and Leakage Properties of Anodized Titania Dielectrics and Their Application in High-Density Capacitors," Journal of Material Science, vol. 50, No. 23, 2015, pp. 7600-7609.

Chentir et al., "Electrical Characterization and Reliability of Lanthanum Doped PZT Thin Films Capacitors," Integrated Ferroelectrics, vol. 96, No. 1, 2008, pp. 75-81.

Bouyssou et al., "Wafer Level Reliability and Leakage Current Modeling of PZT Capacitors," Materials Science and Engineering B, vol. 118, No. 1-3, 2005, pp. 28-33.

Monteiro Diniz Reis et al., "Leakage Current in Low-Temperature PVD PZT Films," 2019 IEEE International Symposium On Applications of Ferroelectrics, Lausanne, Switzerland, 2019, pp. 1-4.

Zhu et al., "Highly Accelerated Lifetime Testing of Potassium Sodium Niobate Thin Films," Applied Physics Letters (APL), vol. 111, No. 21, 2017, pp. 1-5.

Song et al., "Characterization of the Property Degradation of PZT Thin Films With Thickness," Journal of the Korean Physical Society, vol. 58, No. 4, 2011, pp. 809-816.

Genenko et al., "Mechanisms of Aging and Fatigue in Ferroelectrics," Materials Science and Engineering B, vol. 192, 2015, pp. 52-82.

Randall et al., "Improved Reliability Predictions in High Permittivity Dielectric Oxide Capacitors Under High DC Electric Fields With Oxygen Vacancy Induced Electromigration," Journal of Applied Physics, vol. 113, No. 1, 2013, pp. 1-7.

Zhu et al., "Erratum: Highly Accelerated Lifetime Testing of Potassium Sodium Niobate Thin Films," Applied Physics Letters (Apl), vol. 112, No. 15, 2018, pp. 1-2.

* cited by examiner

SEMICONDUCTOR COMPONENT INCLUDING A DIELECTRIC LAYER

FIELD

The present invention relates to a semiconductor component.

BACKGROUND INFORMATION

The "hopping" of a defect type, for example oxygen vacancies, present in a dielectric layer is described in "Improved reliability predictions in high permittivity dielectric oxide capacitors under high dc electric fields with oxygen vacancy induced electromigration" by C. A. Randall, R. Maier, W. Qu, K. Kobayashi, K. Morita, Y. Mizuno, N. Inoue, and T. Oguni, Journal of Applied Physics 113, 014101 (2013), as the reason for breakdown in a dielectric layer. The key model parameters are physically motivated, but are empirically ascertained by fitting to the failure time, assuming only one active defect type. A description of how these parameters correlate more closely with the material is not provided. Complex failure mechanisms, for which multiple defect types are present in the semiconductor layer, are mapped incompletely or not at all. The service life prediction described therein is valid only when, for a load case in question having a certain temperature and a certain electrical field, one defect type dominates, and in addition the failure is caused solely by the accumulation of this one defect type at a boundary layer.

Furthermore, in "Highly accelerated lifetime testing of potassium sodium niobate thin films" by Wanlin Zhu, Betul Akkopru-Akgun, and Susan Trolier-McKinstry, Applied Physics Letters 111, 212903 (2017), typical failure frequencies over the operating period are determined for various operating conditions. It is clear therefrom that the failure mechanism in the material differs within a sample group over the tested operating conditions or even for one particular operating condition. However, it is also not possible, based on the empirical model, to derive links to physical, electrical, or chemical processes in the material.

An object of the present invention is to optimize the service life of a semiconductor component having more than one active defect type, as a function of the provided main operating voltage and main operating temperature of the semiconductor component.

SUMMARY

The object may be achieved by providing a semiconductor component according to an example embodiment of the present invention. Such a semiconductor component is produced on silicon substrates with the aid of thin-film technologies, and may be used, for example, as a piezoelectric actuator for MEMS components such as micromirrors. In accordance with an example embodiment of the present invention, the semiconductor component includes at least one dielectric layer. In addition, the semiconductor component includes at least one first electrode and one second electrode via which a main operating voltage is applied to the dielectric layer. The main operating voltage is the highest allowable potential difference at the two electrodes of the semiconductor component during active operation, according to the specification of the semiconductor component. Furthermore, at least two different defect types are also present in the dielectric layer. These defect types may be vacancies (oxygen or lead vacancies, for example), lattice distortion due to occupied interstices (occupied by hydrogen, for example), Frenkel defects, or also substitutional defects (due to intentionally or unintentionally introduced foreign atoms, for example). These defect types differ from one another with respect to their electrical charge number, for example. A first electrical charge $N_{q,1}$ and a first material- and defect-dependent true activation energy $E_{A,0,1}$ are associated with a first defect type. A second electrical charge $N_{q,2}$ and a second true activation energy $E_{A,0,2}$ are associated with a second defect type. The at least two different defect types accumulate at characteristic times $\tau_1$ and $\tau_2$ at a boundary layer of the two electrodes as a function of a main operating voltage that is applied between the first electrode and the second electrode, and a main operating temperature that is present, and generate maximum changes in barrier height $\delta\Phi_1$ and $\delta\Phi_2$ at the electrodes. The main operating temperature is the highest allowable temperature during active operation, according to the specification of the semiconductor component. $\tau_1$ and $\delta\Phi_1$ are associated with the first defect type, and $\tau_2$ and $\delta\Phi_2$ are associated with the second defect type. The greater the maximum change in barrier height $\delta\Phi_1$ and $\delta\Phi_2$ and the smaller $\tau_1$ and $\tau_2$ of the corresponding defect type are, the more quickly critical change in barrier height $\Delta\phi_{crit}^{+/-}$ is reached at one of the boundary layers between the dielectric layer and the electrodes, resulting in a dielectric breakdown. For the semiconductor component according to an example embodiment of the present invention, $\tau_2$ is greater than $\tau_1$. This means that the second defect type basically requires more time in comparison to the first defect type to move within the dielectric layer toward an electrode and accumulate at a boundary layer of the electrode. However, $\delta\Phi_1 < \delta\Phi_2$ also applies, and therefore maximum change in barrier height $\delta\Phi_2$ generated by the second defect type is greater than maximum change in barrier height $\delta\Phi_1$ generated by the first defect type. Thus, a defect type that has comparatively less influence on the electrical breakdown of the dielectric layer initially reaches the boundary layer. The resulting effect is that critical change in barrier height $\Delta\phi_{crit}^{+/-}$ of the electrode is reached only at a later time, and thus a longer service life is achieved under the operating conditions for which the semiconductor component has been designed.

Maximum changes in barrier height $\delta\Phi_i$ may be influenced, for example, via the selection of the starting materials during the deposition process for the dielectric layer. For example, in the case of a PZT layer, a lead, zirconium, and/or titanium deficit or excess may be set via the composition in the starting material. This means that for the case of a sputter deposition the selection of the target material, and for the case of sol-gel depositions the selection of the precursor sols, may be of importance. Thus, for example, $\delta\Phi_i$'s associated with lead vacancies may be decreased beyond a stoichiometric composition by increasing the lead content in the target or in the precursor sols. In contrast, for example $\delta\Phi_i$'s associated with a lead excess may be decreased by reducing the lead content in the target or in the precursor sols.

Furthermore, maximum changes in barrier height $\delta\Phi_i$ may be changed, for example, via process parameters during the deposition. Thus, for example, elevated temperatures in the PZT sputtering process may result in outgassings of lead, resulting in a reduction of the lead content in the layer. Thus, $\delta\Phi_i$'s associated with lead vacancies could be decreased by reducing the process temperature in the PZT sputtering process.

The involved process gases may also be utilized to influence defect species. Oxygen vacancies, for example, are a known defect type in PZT layers. The quantity of oxygen vacancies present in the material may be influenced, among other ways, by changing the oxygen partial pressure during a PZT sputter deposition. Thus, for example, $\delta\Phi_i$'s associated with oxygen vacancies could be decreased by adding an oxygen flow.

Follow-up processes are often necessary for the passivation and contacting of a semiconductor component. In addition, follow-up processes are often necessary for the production of other components on the same substrate. These follow-up processes may have a very great influence on the electrical service life of a semiconductor component. If hydrogen from follow-up processes penetrates into the lead oxide structure of the PZT, the oxygen may reduce the lead oxide. This creates an oxygen vacancy together with outgassing of $H_2O$ or OH sites, or mobile hydrogen ions result in the structure. The reduction of the hydrogen content in follow-up processes, such as the deposition of passivations in hydrogen-containing plasma processes, results in a reduction of $\delta\Phi_i$'s associated with the oxygen vacancies or hydrogen ions. In such processes, for example the hydrogen content may be reduced by using a lower-hydrogen precursor, for example by using $N_2$ instead of $NH_3$ as a nitrogen source in the deposition of a PECVD SiN passivation. For example, a further option for reducing hydrogen in the deposition of PECVD passivations is to reduce the gas flows of a hydrogen-containing precursor in order to achieve a reduction in $\delta\Phi_i$'s associated with the oxygen vacancies or hydrogen ions.

The quantity of defects and/or $\delta\Phi_i$'s associated with the oxygen vacancies or hydrogen ions may be influenced via a suitable selection of the follow-up processes and/or also by use of hydrogen barriers that envelop the dielectric. Enveloping the PZT with a hydrogen barrier (for example, sputtered metal oxides: RuO, TiO, $AlO_x$) likewise results in a reduction in $\delta\Phi_i$'s associated with the oxygen vacancies or hydrogen ions. A further option for reducing material damage caused by hydrogen is to reduce the temperatures and/or the duration of thermal steps in the follow-up processes in order to provide less energy for the reaction with the dielectric layer. This results in a reduction in $\delta\Phi_i$'s associated with the oxygen vacancies or hydrogen ions.

In a further example embodiment of the present invention, for known dominant oxygen vacancies in the dielectric material, thermal steps in an oxygen atmosphere may be provided. The subsequent introduction of oxygen into a structure with oxygen vacancies results in a reduction of $\delta\Phi_i$'s associated with the oxygen vacancies.

For example, the criterion according to which $\tau_1 < \tau_2$ and $\delta\Phi_1 < \delta\Phi_2$ may be achieved by doping the dielectric layer with at least one further defect type in such a way that $\delta\Phi_1 < \delta\Phi_2$ applies for the maximum changes in barrier height at the contact between the dielectric layer and the electrode. The energetic structure in the material interior may be changed in this way. Thus, for example, for an existing interfering defect type a, having a comparably small $\tau_1$ and a large $\delta\Phi_1$, new deeper, localized defect centers not previously present, i.e., having a lower local minimum of the potential energy, are created. The mobility of interfering defect type a may thus be reduced. Introducing the further defect type may in fact result in a further large maximum barrier height decrease $\delta\Phi_3$. However, this decrease for the corresponding main operating condition preferably only takes place at a point in time after the electrical failure of the dielectric layer at point in time $t_{crit}$. The reason is that the involved further defect type has a characteristic time constant $\tau_3$ that is so large that, up to the failure of the component, the further defect type cannot accumulate at a boundary layer of the electrodes.

Defects may also be unintentionally introduced into the starting materials due to contaminations, which may be reduced by increasing the degree of purity of the starting materials, for example of the target for sputtering, or of the precursor sols in the sol-gel process. The reduction of foreign substances (iron, chlorine, for example) in the structure of the dielectric layer thus reduces $\delta\Phi_i$'s associated with these defects.

When field-activated defects dominate over thermally activated defects, increasing the thickness of the dielectric layer is a further option for changing the sequence in the defect structure. Increasing the thickness of the dielectric layer, for example for the case of piezoelectric actuators with PZT in particular, is an option for increasing the service life with the actuator force unchanged, since a small electrical field increases all time constants $\tau_i$ of the involved i defect types.

Over the load period up to dielectric failure, a semiconductor component in accordance with an example embodiment of the present invention shows a temporal profile of leakage current density $J_{TED}$, which is described by the equation of thermionic emission diffusion theory according to Crowell and Sze:

$$J_{TED} = \frac{q \cdot N_C \cdot v_R}{1 + \frac{v_R}{v_D}} \cdot e^{-\frac{\Phi_B^{eff}}{k_B \cdot T}} \cdot \left[ e^{\frac{q \cdot U}{k_B \cdot T}} - 1 \right] \quad (1)$$

where q is the unit charge, $N_C$ is the effective density of states in the conduction band, $v_R$ is the effective recombination velocity, $v_D$ is the effective diffusion velocity, $\phi_B^{eff}$ is the effective Schottky barrier, $k_B$ is the Boltzmann constant, T is the ambient temperature, and U is the potential difference across the dielectric layer. In this regard, U means the main operating voltage that is applied to the two electrodes of the semiconductor component.

The temporal profile of the leakage current density results from the change in effective Schottky barrier $\phi_B^{eff}(t)$. This change or Schottky barrier $\phi_B^{eff}(t)$ characterizes the influence of the two boundary layers, situated between the two electrodes and the dielectric layer, on the leakage current density. The effective Schottky barrier is also referred to below as $\phi(t)$ for short, and encompasses all components of semiconductor-electrode material transfer, changes due to the applied main operating voltage, and changes due to the accumulation of defects. The logarithm of the leakage current density reduces equation (1) to a time constant K and a time-variable term, which reflects the processes in the material interior that are caused by the movements of all mobile defects contained in the material:

$$\ln(J_{TED}(t)) = \ln(K) - \frac{\Phi(t)}{k_B \cdot T}, \text{ where } K = \frac{q \cdot N_C \cdot v_R}{1 + \frac{v_R}{v_D}} \cdot \left[ e^{\frac{q \cdot U}{k_B \cdot T}} - 1 \right] \quad (2.1)$$

The term "defect" also encompasses structural changes in the structure.

The displacement of the defects upon approach to the electrodes results in defect accumulations in the dielectric layer which result in changes in the effective barrier height. Solving equation 2.1 for φ results in $$\Phi(t) = [\ln(K) - \ln(J_{TED}(t))]k_B T \quad (2.2)$$

This temporal profile of the effective barrier height due to the accumulation of defects is described by the approach $$\phi(t) = \phi^+(t) + \phi^-(t) = \phi_0^+ + \sum_i \Delta\phi_i^+(t) + \phi_0^- + \sum_i \Delta\phi_i^-(t) \quad (3.1)$$

$$\phi(t) = \phi_0 + \sum_i \Delta\phi_i^+(t) + \sum_i \Delta\phi_i^-(t), \text{ where } \phi_0 = \phi_0^+ + \phi_0^- \quad (3.2)$$

In general, accumulations and associated changes in the effective Schottky barrier occur at both boundary layers $\phi^+(t)$ and $\phi^-(t)$. Indices + and − each denote the changes at the boundary layer, which characterizes the transition from minority charge carriers or majority charge carriers in the dielectric layer. The boundary layers have an output barrier height $\phi_0$, and experience changes in barrier height $\Delta\phi_i$ caused by a defect type i. Defect pairs or defect accumulations must always be present due to the necessary charge neutrality. This means that when defects with a negative charge occur, defects with a positive charge also exist in the material. The effects of these defects are respectively denoted by indices + and −. The individual defects move in the opposite direction in the applied electrical field of the main operating voltage, depending on their charge. Defects with a positive charge migrate to the electrode having a negative potential, and accumulate in the vicinity thereof in the dielectric layer. Defects with a negative charge move to the electrode having a positive potential, and in turn accumulate in the vicinity thereof.

Change in barrier height $\Delta\phi_i$, which is brought about by defect type i, is characterized by its maximum height $\delta\phi_i$ and a characteristic time constant $\tau_i$ in which the change in barrier height changes most greatly:

$$\Delta\phi_i^{+/-}(t) = \delta\phi_i^{+/-}\left(1 - e^{-\frac{t}{\tau_i^{+/-}}}\right) \quad (4)$$

In general, $\delta\phi_i$ is a function of defect number $Z_i$, but is additionally a function of the type of boundary layer. The effect of the defect number cannot be generalized, since a significant change in barrier height $\Delta\phi_i$ may already result due to accumulation of a monolayer. Therefore, for materials according to an example embodiment of the present invention, $Z_i > 0$ alone is crucial. The term $$\left(1 - e^{-\frac{t}{\tau_i^{+/-}}}\right)$$

in the above formula represents an approximation of the statistical accumulation of a defect distribution that is present in the material. The positive and negative maximum heights of barrier change $\delta\phi^+$ and $\delta\phi^-$ and associated time constants $\tau_i^+$ and $\tau_i^+$ have different magnitudes, since different defects and different boundary layers are involved. Together with formula (3.2), this results in $$\phi(t) = \phi_0 + \sum_i \delta\phi_i^{+/-}\left(1 - e^{-\frac{t}{\tau_i^{+/-}}}\right), \quad (5)$$

and for the time-variable portion of the barrier change, results in $$\Delta\phi(t) = \sum_i \delta\phi_i^{+/-}\left(1 - e^{-\frac{t}{\tau_i^{+/-}}}\right) \quad (5.1)$$

Time constant $\tau_i^{+/-}$ is defined by the mobility of the defects in the dielectric layer and the distance to be covered in this layer. During the displacement within the dielectric layer, defect type i must cover distance $d_i$ of the center of gravity of its distribution with respect to the boundary layer. Together with velocity $v_i$, the characteristic time constant for the accumulation process of defect type i results in $$\tau_i = \frac{d_i}{v_i} \quad (6)$$

Semiconductor components according to an example embodiment of the present invention are characterized by a displacement of the defects in the applied electrical field of the main operating voltage via hopping. Defect type i moves along localized defect states having an average effective distance $a_i$. This results in a hopping velocity $v_i$, which is described via the known approach of variable range hopping:

$$v_i = C_{0,i}(a_i) e^{-\frac{E_{A,0,i}}{k_B T}} \sinh\left(\frac{N_{q,i} a_i E}{k_B T}\right), \text{ where } E = \frac{U}{d} \quad (7)$$

$$C_{0,i}(a_i) = v_0 a_i e^{-\frac{2a_i}{\alpha}} \quad (7.1)$$

$C_{0,i}(a_i)$ represents a function that describes the influence of the local defect distribution. As is customary for variable range hopping, hopping attempt frequency $v_i$ refers to the frequency with which a defect runs up against potential barriers that are present. In addition, the hopping likelihood of the defect is proportional to overlap integral $$e^{-\frac{2a_i}{\alpha}}$$

of the wave functions of two hydrogen-like localized defects having decay length $\alpha$ at distance $a_i$ of the localized defect states. $C_{0,i}(a_i)$ represents a function that describes the influence of the local defect distribution. The hopping likelihood, which increases with the operating temperature, is taken into account via the exponential term containing material- and defect-dependent true activation energy $E_{A,0,i}$. True activation energy $E_{A,0,i}$ refers to an activation energy that is independent of the operating voltage and operating temperature. The term $\exp(-E_{A,0,i}/(k_B T))$ becomes dominant as the main operating temperature increases and the main operating voltage at the same time decreases. This means that under these operating conditions, defect types with high true activation energy and low charge contribute to the electrical failure of the semiconductor component. The hyperbolic sine, which contains the product of charge $N_{q,i}$ associated with defect i, average localized defect center distance $a_i$, and electrical field E, describes the targeted lowering of the energy barriers in the hopping process. Electrical field E results from applied main operating voltage U and thickness d of the dielectric layer. The term sink ($N_{q,i} a_i E/(k_B T)$) gains in influence with increasing main operating voltages and decreasing main operating temperatures. In this case, defect types with a high charge number and at the same time with low true activation energy contribute to the electrical failure of the semiconductor component.

For a semiconductor component, the n defect types contained in the dielectric layer move across localized defect states having same average distance $a_0$, so that the following applies:

$$a_1 = a_2 \ldots a_n = a_0 \quad (8)$$

This distance of the localized defect states may be extracted from leakage current data $J_{TED}$ with knowledge of the physical modeling described above. The average effective distance $a_0$ represents a key material property for the dielectric failure under thermal load and voltage load. This material property is independent of the operating voltage and the operating temperature, and may be influenced via the manufacturing process.

With knowledge of the physical modeling described above, for involved i defect types, charge $N_{q,i}$ and true activation energy $E_{a,0,i}$ may be determined from leakage current data $J_{TED}$. In addition, for an operating state the associated temporal profile of barrier decrease $\Delta\phi_i$ may be ascertained. This temporal profile of barrier decrease $\Delta\phi_i$ is described by characteristic time constant $\tau_i$, in which change in barrier height $\Delta\phi_i$ changes most greatly, and by its maximum decrease in barrier height $\delta\phi_i$. With knowledge of charge $N_{q,i}$ and true activation energy $E_{a,0,i}$, the defect types may be identified over various operating states and associated with their effect $\Delta\phi_i$, which differs according to the operating state. Thus, for semiconductor components it is possible to identify the operating state via which a long service life may be achieved. This operating state is characterized in that faster defect types with time constants $\tau_i$ less than failure time $t_{crit}$ have comparably small maximum decreases in barrier height $\delta\phi_i$.

For semiconductor components, critical changes in barrier heights $\Delta\phi_{crit}^{+/-}$ exist for the two boundary layers. If one of these critical changes in barrier heights $\Delta\phi_{crit}^{+/-}$ is reached or exceeded locally at point in time $t_{crit}$, the dielectric breakdown takes place locally. This means that when $\Delta\phi_{crit}^+$ is reached, the breakdown takes place via tunneling minority charge carriers (case 1):

$$\phi_{crit}^+ = \phi_0^+ + \sum_i \Delta\phi_i^+(t_{crit}) = \phi_0^+ + \Delta\phi_{crit}^+, \quad (9.1)$$

$$\text{where } \Delta\phi_{crit}^+ = \sum_i \Delta\phi_i^+(t_{crit})$$

In contrast, when $\phi_{crit}^-$ is reached, the breakdown takes place via tunneling majority charge carriers (case 2):

$$\phi_{crit}^- = \phi_0^- + \Sigma_i \Delta\phi_i^-(t_{crit}) = \phi_0^- + \Delta\phi_{crit}^-, \quad (9.2)$$

$$\text{where } \Delta\phi_{crit}^- = \Sigma_i \Delta\phi_i^-(t_{crit})$$

When $\Delta\phi_{crit}$ is locally reached, a local increase in the current density up to the local destruction of the semiconductor element takes place. In the curve of leakage current density $J_{TED}$ at point in time $t=t_{crit}$, this is apparent either via a brief rise, followed by a direct reversion to the $J_{TED}$ value prior to the increase, or via a continuous jump. In the first case, the conduction path itself is thermally destroyed. In the second case, the supplied electrical power is not sufficient to completely destroy the conduction path. After $t_{crit}$ is exceeded, a semiconductor component remains which is locally destroyed on a limited surface. Increasing load with $t > t_{crit}$ results in even further local dielectric breakdowns, which ultimately results in complete destruction of the semiconductor component. The first local breakdown thus represents a relevant measure for the service life of the semiconductor component.

By use of the physical description of the change in barrier height (5) via hopping transport of the n defect types (6) and (7), charge $N_{q,i}$, true activation energy $E_{a,0,i}$, the level of maximum barrier changes $\delta\phi_i$, and characteristic time constant $\tau_i$ may thus be ascertained from temporal profiles of the leakage current density (1). Semiconductor components may be improved in a targeted manner by this measurement before and after a variation in the manufacturing process.

For this purpose, leakage current curves $J_{TED}$ up to the dielectric breakdown at point in time $t_{crit}$ are initially measured at a semiconductor component at at least two operating voltages $U_1$ and $U_2$ and at least two main operating temperatures $T_1$ and $T_2$. Equations (2.2) and (5) described above are subsequently set equal to one another, and the temporal profile of change in barrier height $\Delta\phi$, individual variables $\delta\phi_i$, and $\tau_i$ as a function of the operating voltage result from a numerical fit, based on the temporal profile of $J_{TED}$. By use of (9.1) or (9.2), critical barrier decrease $\Delta\phi_{crit}$ as a function of the main operating voltage and main operating temperature is also obtained.

$\tau_i$ is obtained as a function of electrical field E and the main operating temperature according to formulas (6), (7), and (8) described above:

$$\tau_i(E; T) = \frac{d_i}{C_{0,i}(a_0) e^{-\frac{E_{A,o,i}}{k_B T}}} \frac{1}{\sinh\left(\frac{N_{q,i} a_0}{k_B T} E\right)} = \tilde{K}_i(a_0) \frac{1}{\sinh\left(\frac{N_{q,i} a_0}{k_B T} E\right)} \quad (10.1)$$

When n>1 defects are present, variables $N_{q,i}$, $E_{a,0,i}$, and $a_0$ may be determined from equation (10.1), based on $\tau_i$ thus ascertained, at at least two main operating temperatures $T_1$ and $T_2$, and at least two main operating voltages $U_1=E_1/d$ and $U_2=E_2/d$, by mathematical fitting. The measured $J_{TED}$ curves are subject to manufacturing variations and tolerances which result from the measuring technique used. The accuracy of material properties $a_0$, $C_{0,i}(a_0)$, $N_{q,i}$, and $E_{A,0,i}$, determined from these measurements, may thus be improved by increasing the number of samples, and also by additional measured data for more than two voltages and/or more than two temperatures.

After a change in the process conditions, the determination of $\delta\phi_i$ and $\tau_i$ is repeated and unequivocally associated with a defect type via variables $N_{q,i}$ and $E_{a,0,i}$. The physical influence of the process change on the involved i defects is thus shown.

At least one further, third defect type is preferably present in the dielectric layer. The third defect type is designed to accumulate at one of the two electrodes as a function of the main operating voltage that is applied between the first electrode and the second electrode and of the main operating temperature that is present at a characteristic time $\tau_3$, and to generate a maximum change in barrier height $\delta\Phi_3$ at the electrodes. $\tau_1<\tau_2<\tau_3$ applies, the sequence of maximum changes in barrier height differing from sequence $\delta\Phi_1>\delta\Phi_2>\delta\Phi_3$. This means that, for example, $\delta\Phi_3>\delta\Phi_2>\delta\Phi_1$ or $\delta\Phi_2>\delta\Phi_1>\delta\Phi_3$ applies. Dielectric layers in which more than only two different defect types are present occur more frequently. In the case of a PZT layer, for example at least local excesses or deficits of the atoms Pb, Ti, and Zr are present in the dielectric layer. In addition, in practice, operating states occur in which more than two defects make a relevant contribution to the electrical failure of the dielectric layer.

The dielectric layer is preferably designed as a polycrystalline oxidic high-k dielectric and in particular as a $Pb[Zr_xTi_{1-x}]O_3$ (PZT), doped $Pb[Zr_xTi_{1-x-y}]O_3Ni_y$ (PZT), $[K_xNa_{1-x}]NbO_3$ (KNN), $HfO_2$, $ZrO_2$, or $SrTiO_3$ layer.

The dielectric layer is preferably designed as a sputtered PZT layer. The so-called target material is deposited in a plasma on a substrate. PZT, for example, is used as target material. In this regard, the sputtered PZT layer preferably has a deposition temperature of less than 500° C. Such a dielectric layer demonstrably results in the effect that more than two defect types actively contribute to the dielectric failure as a function of the selected main operating voltage and main operating temperature.

The sputtered PZT layer preferably has a composition of $Pb_x(Zr_{0.52}Ti_{0.48})O_3$. The following applies for x: $1.2 \leq x \leq 1.3$, so that the composition may be made up of $Pb_{1.2}(Zr_{0.52}Ti_{0.48})O_3$ or $Pb_{1.3}(Zr_{0.52}Ti_{0.48})O_3$. Alternatively, the sputtered PZT layer of the semiconductor component has a nickel content between 0.1 and 1 atom percent. Furthermore, additional defects may preferably be introduced into the high-k dielectrics via dopings in order to influence maximum changes in barrier height $\delta\Phi$ and time constants $\tau$.

DETAILED DESCRIPTION OF EXAMPLE EMBODIMENTS

Figure 1A:
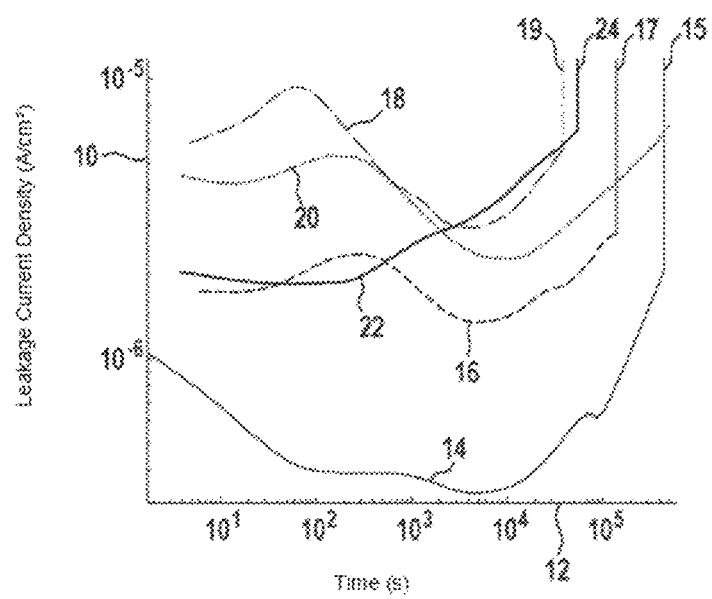
FIG. 1A shows the curve of a leakage current measurement for five different dielectric layers.

FIG. 1A shows curve 14 of a leakage current measurement of a dielectric layer of a semiconductor component, referred to below as exemplary embodiment 1. Time is logarithmically plotted on X axis 12 in units of seconds, and the leakage current density is logarithmically plotted on Y axis 10 in units of amperes per square centimeter. Exemplary embodiment 1, provided for the leakage current measurement, encompassed a silicon substrate including dielectric passivation layers and a first electrode deposited thereon. This first electrode included a double layer made of PVD platinum 110 nm thick, which was covered by a conductive 100-nm lanthanum nickel oxide buffer layer (referred to below as an LNO layer). This LNO layer was likewise applied via PVD. The dielectric layer situated on the first electrode had a thickness of 1 μm, and was deposited in an RF PVD process at a temperature of 480° C. and with a target composition of $Pb_{1.3}(Zr_{0.52}Ti_{0.48})O_3$. The remaining process parameters of the above-described depositions were selected in such a way that the dielectric layer had polycrystalline growth, preferably with a (100) c axis orientation. The second electrode of the semiconductor element, which represented a platinum electrode 110 nm thick, was applied to the dielectric layer via PVD. The semiconductor component corresponding to exemplary embodiment 1 was passivated, and was not subjected to thermal aftertreatment after the passivation and the electrical contacting.

In addition, FIG. 1A shows curve 16 of a leakage current measurement of a dielectric layer of a further semiconductor component, referred to below as exemplary embodiment 2.

The production of exemplary embodiment 2 took place analogously to exemplary embodiment 1, except that the components were subjected to thermal aftertreatment after electrical contacting. The thermal aftertreatment was carried out at 450° C. for 40 minutes in a 60 mbar nitrogen atmosphere.

Furthermore, FIG. 1A shows curve 18 of a leakage current measurement of a dielectric layer of a further semiconductor component, referred to below as exemplary embodiment 3. The production of exemplary embodiment 3 took place analogously to exemplary embodiment 1, except that the components were subjected to thermal aftertreatment after electrical contacting. The thermal aftertreatment was carried out at 500° C. for 40 minutes in a 60 mbar nitrogen atmosphere.

Moreover, FIG. 1A shows curve 20 of a leakage current measurement of a dielectric layer of a further semiconductor component, referred to below as exemplary embodiment 4. The production of exemplary embodiment 4 took place analogously to exemplary embodiment 1, except that the dielectric layer was deposited with a target composition of $Pb_{1.2}(Zr_{0.52}Ti_{0.48})O_3$.

Furthermore, FIG. 1A shows curve 22 of a leakage current measurement of a dielectric layer of a further semiconductor component, referred to below as exemplary embodiment 5. The production of exemplary embodiment 5 took place analogously to exemplary embodiment 1, except that the dielectric layer was deposited with a target composition of $Pb_{1.3}(Zr_{0.52}Ti_{0.48})O_3Ni_{0.005}$.

Prior to the measurement of the leakage current curves, all described exemplary embodiments 1, 2, 3, 4, and 5 were covered with passivation layers and electrically contacted via aluminum strip conductors.

Four of the five exemplary embodiments were measured up to the respective dielectric breakdown 15, 17, 19, and 24. It is apparent that very different leakage current curves 14, 16, 18, 20, and 22 with different breakdown times 17, 15, 19, and 24 result, depending on the production and the composition of a dielectric layer.

Figure 1B:
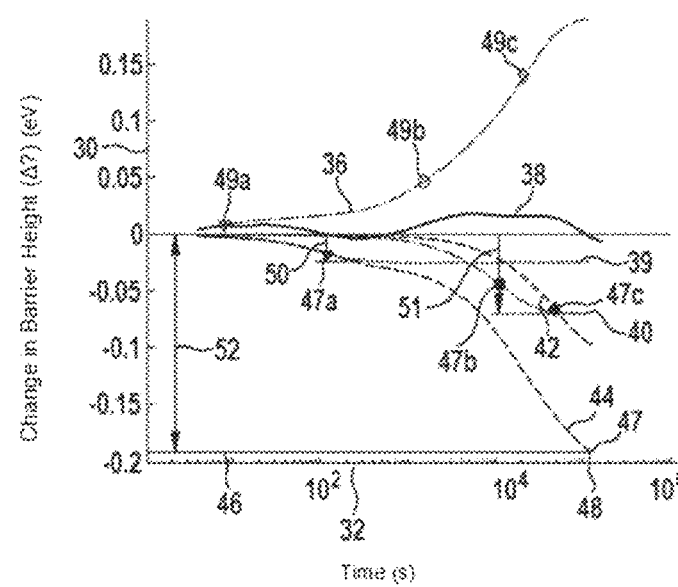
FIG. 1B shows the temporal profile of the effective barrier height that results from a leakage current measurement, and the subdivision into the contributions of the defect types that are present.

FIG. 1B shows an example of the extraction of model variables based on measured leakage current curve 16 for exemplary embodiment 2, based on FIG. 1A. Once again, time is logarithmically plotted on X axis 32 in units of seconds, and change in barrier height $\Delta\phi$ is logarithmically plotted on Y axis 30 in units of electron volts. Curve 38 shows the ascertained curve of the change in barrier height $\Delta\phi(t)$ as a function of time, starting from an output barrier height $\phi_0$.

This curve 38 of change in barrier height $\Delta\phi(t)$ is ascertained by the following formula (cf. above formula 2.2):

$$\Phi(t) = [\ln(K) - \ln(J_{TED}(t))]k_B T$$

The ascertained temporal profile of average effective barrier height $\phi(t)$ is subsequently numerically adapted to the formula (cf. above formula 3.2):

$$\phi(t) = \phi_0 + \sum_i \Delta\phi_i^+(t) + \sum_i \Delta\phi_i^-(t)$$

Correspondingly different $\Delta\phi_i^{+/-}(t)$'s which describe the curve of $\Delta\phi(t)$ are obtained from this numerical fit. Thus, in the case shown, $\Delta\phi(t)$ 38 is described by the curve of $\Delta\phi_a^-(t)$ 39, the curve of $\Delta\phi_b^-(t)$ 40, and the curve of $\Delta\phi_c^-(t)$ 42, together with summation curve $\Sigma_i\Delta\phi_i^+$ 36. According to the following formula (cf. above formula 5.1)

$$\Delta\phi(t) = \sum_i \delta\phi_i^{+/-}\left(1 - e^{\frac{-t}{\tau_i^{+/-}}}\right)$$

the different $\tau_i^{+/-}$'s and $\delta\phi_i^{+/-}$'s may then be ascertained. In this case, for changes in barrier height $\Delta\phi_i^-$ 39, 40, and 42 associated with the majority charge carriers, associated characteristic time constants $\tau_a$, $\tau_b$, and $\tau_c$ are obtained. These time constants are characterized in FIG. 1B by 47a, 47b, and 47c, respectively, and represent the point in time at which the corresponding change in barrier height changes most greatly. Associated maximum barrier decreases $\delta\phi_i^-$ for curves $\Delta\phi_i^-$ 39, 40 are denoted by reference numerals 50 and 51 by way of example. In order to improve clarity, the changes in barrier height for minority charge carriers $\Delta\phi^+$ have not been explicitly individually illustrated. Only their summation curve $\Sigma_i\Delta\phi_i^+$ 36 together with individual time constants $\tau_d$, $\tau_e$, and $\tau_f$ 49a, 49b, and 49c are shown. A particular characteristic time constant is associated with a defect type a, b, c, d, e, and f that is present in the layer. Accordingly, six different defect types are thus present in this dielectric layer.

In the case illustrated in FIG. 1B, dielectric breakdown 47 of the dielectric layer takes place via tunneling majority charge carriers corresponding to the following formula (cf. above formula 9.2):

$$\phi_{crit}^- = \phi_0^- + \sum_i \Delta\phi_i^-(t_{crit}) = \phi_0^- + \Delta\phi_{crit}^-,$$

where $\Delta\phi_{crit}^- = \sum_i \Delta\phi_i^-(t_{crit})$

The previously ascertained curves of $\Delta\phi_a^-(t)$ 39, $\Delta\phi_b^-(t)$ 40, and $\Delta\phi_c^-(t)$ 42 are thus summed, resulting in changes in barrier height $\Sigma_i \Delta\phi^-$ 44, corresponding to its curve. If change in barrier height $\Delta\phi_{crit}^-$ 52 of the dielectric layer, which is critical for the majority charge carriers, is reached at point in time $t_{crit}$ 48, this results in a local breakdown of the layer due to the different defect types a, b, and c present which have accumulated at a boundary layer between the dielectric layer and the electrode.

Figure 2A:
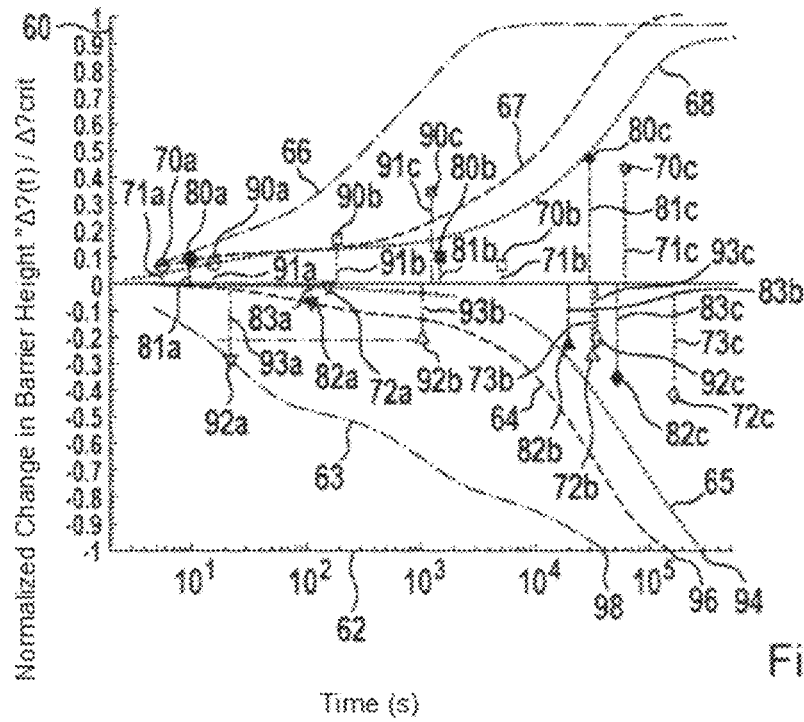
FIG. 2A shows the maximum changes in barrier height and characteristic time constants of three exemplary embodiments for the operating state 175° C./−2.5 V by way of example.

FIG. 2A shows the measured curves of changes in barrier height $\Delta\phi(t)^\pm$ for the three exemplary embodiments 1, 2, and 3, together with respective characteristic time constants $\tau_i^{+/-}$ and maximum changes in barrier height $\delta\phi^{+/-}$ at a main operating temperature of 175° C. and a main operating voltage of −2.5 V. Time is logarithmically plotted on X axis 62 in units of seconds, and the change in barrier height divided by critical change in barrier height $\Delta\phi_{crit}^-$ of the particular exemplary embodiment 1, 2, and 3 is plotted on Y axis 60 without units.

The curves of $\Delta\phi(t)^-$ 63, 64, 65 for exemplary embodiments 3, 2, and 1 as well as the associated curves of $\Delta\phi(t)^+$ 66, 67, 68 of exemplary embodiments 3, 2, and 1 are illustrated. The electrical failure of the dielectric layers in the exemplary embodiments takes place in each case at associated points in time 94, 96, and 98 at which the critical decrease in barrier height is reached.

The defect structure for exemplary embodiment 1 is made up of defect types a, b, c, d, e, and f together with their associated time constants $\tau_a$ 72a, $\tau_b$ 72b, $T_c$ 72c, $\tau_d$ 90a, $\tau_e$ 70b, and $\tau_f$ 70c. Resulting maximum decreases in barrier height $\delta\phi_b^-$ 72c, $\delta\phi_c^-$ 73c, $\delta\phi_d^+$ 91a, $\delta\phi_e^+$ 71b, and $\delta\phi_f^+$ 71c are associated with the different defect types.

The defect structure for exemplary embodiment 2 is made up of defect types a, b, c, d, e, and f together with their associated time constants $\tau_a$ 82a, $\tau_b$ 82b, $\tau_c$ 82c, $\tau_d$ 80a, $\tau_e$ 80b, and $\tau_f$ 80c. In addition, resulting maximum decreases in barrier height $\delta\phi_a^-$ 83a, $\delta\phi_b^-$ 83b, $\delta\phi_c^-$ 83c, $\delta\phi_d^+$ 81a, $\delta\phi_e^+$ 81b, and $\delta\phi_f^+$ 81c are associated with the different defect types.

The defect structure for exemplary embodiment 3 is made up of defect types a, b, c, d, e, and f together with their associated time constants $\tau_a$ 92a, $\tau_b$ 92b, $\tau_c$ 92c, $\tau_d$ 70a, $\tau_e$ 90b, and $\tau_f$ 90c. Once again, resulting maximum decreases in barrier height $\delta\phi_a^-$ 93a, $\delta\phi_b^-$ 93b, $\delta\phi_c^-$ 93c, $\delta\phi_d^+$ 71a, $\delta\phi_e^+$ 91b, and $\delta\phi_f^+$ 91c are associated with the different defect types.

True activation energies $E_{A,0,i}$ and charges $N_{q,i}$ may be ascertained for the different defect types by mathematical fitting to the above-described model and the following equation (cf. above equation 10.1).

$$\tau_i(E; T) = \frac{d_i}{C_{0,i}(a_0)e^{-\frac{E_{A,o,i}}{k_B T}}} \frac{1}{\sinh\left(\frac{N_{q,i}a_0}{k_B T}E\right)}$$

A true activation energy of 0.92 eV with a charge of 1 e results for defect type a. A true activation energy of 0.95 eV with a charge of 3 e results for defect type b. A true activation energy of 0.855 eV with a charge of 4 e results for defect type c. A true activation energy of <0.8 eV with a charge of 1 e results for defect type d. A true activation energy of 1.04 eV with a charge of 2 e results for defect type e. A true activation energy of 1.22 eV with a charge of 2 e results for defect type f. In this way, for example defect type a may be physically joined to hydrogen and/or OH groups, and defect type e may be physically joined to oxygen vacancies and/or lead within the dielectric layer. Due to the different types of production of exemplary embodiments 1, 2, and 3, the maximum decreases in barrier height of defect types a and e, $\delta\phi_a^-$ and $\delta\phi_e^+$, respectively, are changed. For the main operating conditions selected here by way of example, $\tau_a<\tau_b$ and $\delta\phi_a^-<\delta\phi_b^-$ apply for exemplary embodiments 1 and 2 of the semiconductor component. Barrier curve 63 of exemplary embodiment 3 is influenced by relatively large barrier decrease 93a of exemplary embodiment 3, which takes place at a relatively early point in time 92a. This results in an earlier electrical failure at point in time $t_{crit}$ 98 in comparison to failure points in time $t_{crit}$ 94 or 96 of exemplary embodiments 1 or 2. To achieve a longer service life of the semiconductor component, barrier decreases that take place early should be correspondingly small. For exemplary embodiments 1 and 2, it is also shown that $\tau_a<\tau_b<\tau_c$ and $\delta\phi_a^-<\delta\phi_b^-<\delta\phi_c^-$.

Figure 2B:
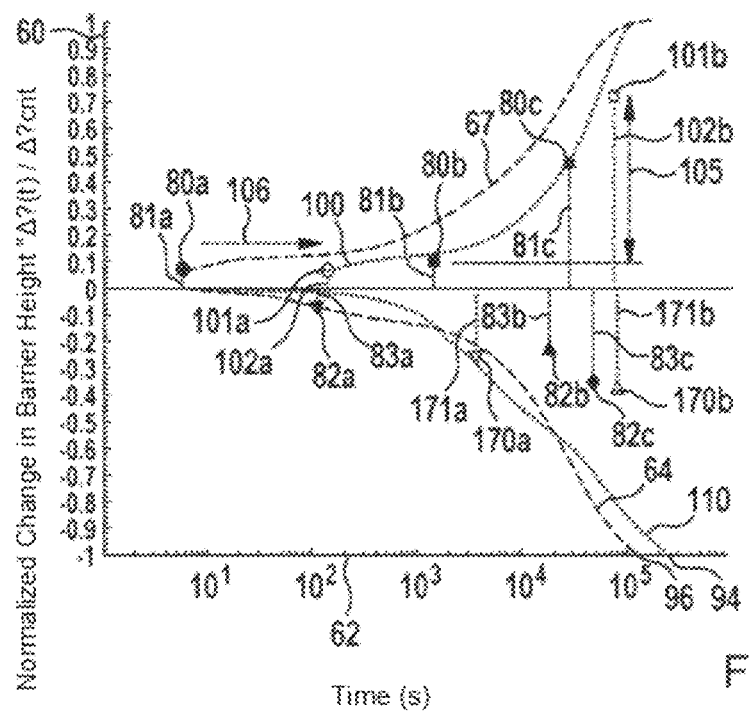
FIG. 2B shows the maximum changes in barrier height and characteristic time constants for one exemplary embodiment for two operating states 175° C./−2.5 V and 100° C./−10 V by way of example.

FIG. 2B shows a comparison of the curves of changes in barrier height $\Delta\phi(t)^\pm$ for exemplary embodiment 2 for two different operating conditions, together with particular characteristic time constants $\tau_i^{+/-}$ and maximum changes in barrier height $\delta\phi_i^{+/-}$. Time is logarithmically plotted on X axis 62 in units of seconds, and the change in barrier height divided by critical change in barrier height $\Delta\phi_{crit}^-$ of the particular operating state is plotted on Y axis 60 without units.

This results in curve $\Delta\phi(t)^-$ 64 for the main operating temperature 175° C. and a main operating voltage of −2.5 V (referred to below as operating condition a), and curve $\Delta\phi(t)^-$ 110 for the main operating temperature 100° C. and a main operating voltage of −10 V (referred to below as operating condition b). Associated curve $\Delta\phi(t)^+$ 67 for operating condition a and curve $\Delta\phi(t)^+$ 100 for operating condition b are likewise illustrated.

The electrical failure of the dielectric layer takes place for operating conditions a and b at points in time 96 and 97, respectively. The defect structure for exemplary embodiment 2 for operating condition a is formed by active defect types a, b, c, d, e, and f together with their associated time constants $\tau_a$ 82a, $\tau_b$ 82b, $\tau_c$ 82c, $\tau_d$ 80a, $\tau_e$ 80b, and $\tau_f$ 80c up to electrical failure, and maximum decreases in barrier height $\delta\phi_a^-$ 83a, $\delta\phi_b^-$ 83b, $\delta\phi_c^-$ 83c, $\delta\phi_d^+$ 81a, $\delta\phi_e^+$ 81b, and $\delta\phi_f^+$ 81c caused by these defect types.

The defect structure for exemplary embodiment 2 for operating condition b is formed by active defect types a, b, d, and e together with their associated time constants $\tau_a$ 170a, $\tau_b$ 170b, $T_d$ 101a, and $\tau_e$ 101b up to electrical failure, and maximum decreases in barrier height $\delta\phi_a^-$ 171a, $\delta\phi_b^-$ 171b, $\delta\phi_d^+$ 102a, and $\delta\phi_e^+$ 102b caused by these defect types.

It is apparent that the defect structure and the active defects in a semiconductor component up to electrical breakdown are a function of the selected operating condition. Time shifts 106 result from the main operating temperature and term $$e^{-\frac{E_{A,0,i}}{k_B T}}$$

in equation (10.1). Changes 105 in the maximum decreases in barrier height result from changes in the main operating voltage and accompanying changes in $\Delta\phi_{crit}^\pm$.

For exemplary embodiment 2, $\tau_a<\tau_b<\tau_c$ and $\delta\phi_a^-<\delta\phi_b^-<\delta\phi_c^-$, and $\tau_d<\tau_e<\tau_f$ and $\delta\phi_d^+<\delta\phi_e^+<\delta\phi_f^+$, apply for operating conditions a. In addition, for exemplary embodiment 2 $\tau_a<\tau_b$ and $\delta\phi_a^-<\delta\phi_b^-$, and $\tau_d<\tau_e$ and $\delta\phi_d^+<\delta\phi_e^+$, apply for operating conditions b.

Figure 2C:
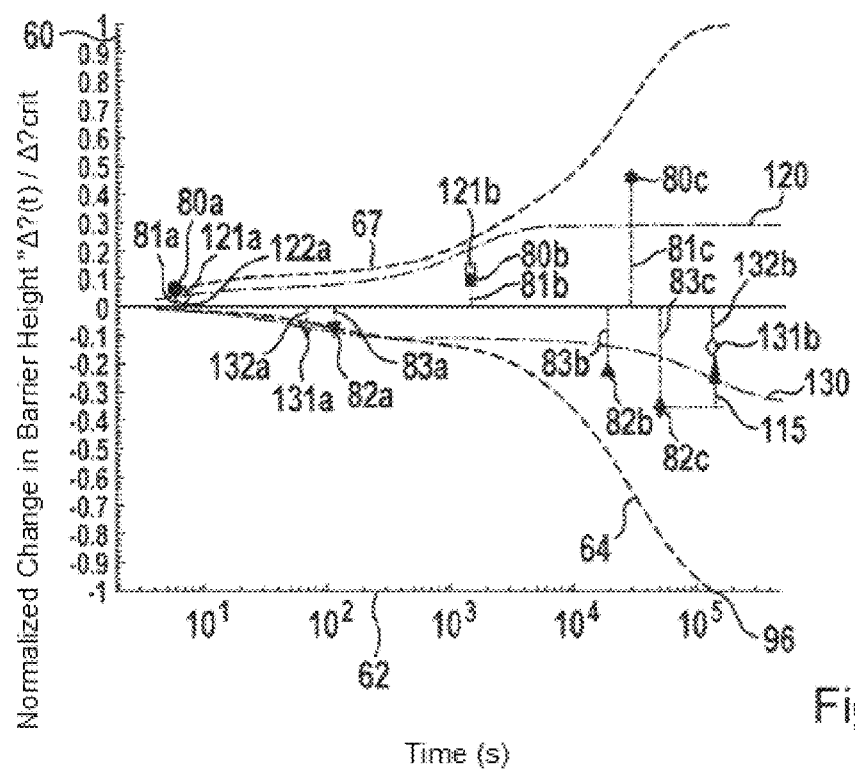
FIG. 2C shows the maximum changes in barrier height and characteristic time constants of two exemplary embodiments for the operating state 175° C./−2.5 V by way of example.

FIG. 2C shows a comparison of the curves of changes in barrier height $\Delta\phi(t)^\pm$ for the two exemplary embodiments 2 and 4 together with their particular characteristic time constants $\tau_i^{+/-}$ and maximum changes in barrier height $\delta\phi_i^{+/-}$ at a main operating temperature of 175° C. and a main operating voltage of −2.5 V. Time is logarithmically plotted on X axis 62 in units of seconds, and the change in barrier height divided by critical change in barrier height $\Delta\phi_{crit}$ of exemplary embodiment 2 is plotted on Y axis 60 without units. The change in barrier height in exemplary embodiment 4 has been normalized in such a way that maximum changes in barrier height $\delta\phi_a^-$ 132a and $\delta\phi_a^-$ 83a are identical.

Curve $\Delta\phi(t)^-$ 64 of exemplary embodiment 2 and curve $\Delta\phi(t)^-$ 130 of exemplary embodiment 4 are illustrated. Curve $\Delta\phi(t)^+$ 67 of exemplary embodiment 2 and curve $\Delta\phi(t)^+$ 120 of exemplary embodiment 4 are also illustrated. The electrical failure of the dielectric layer of exemplary embodiment 2 takes place at point in time 96 when the critical decrease in barrier height is reached. During the test period it was not possible to subject exemplary embodiment 4 to load to the point of failure, and therefore curve 130 does not reach the value −1.

The defect structure for exemplary embodiment 2 is formed by defect types a, b, c, d, e, and f together with their associated time constants $\tau_a$ 82a, $\tau_b$ 82b, $\tau_c$ 82c, $\tau_d$ 80a, $\tau_e$ 80b, and $\tau_f$ 80c, and maximum decreases in barrier height $\delta\phi_a^-$ 83a, $\delta\phi_b^-$ 83b, $\delta\phi_c^-$ 83c, $\delta\phi_d^+$ 81a, $\delta\phi_e^+$ 81b, and $\delta\phi_f^+$ 81c caused by these defect types.

The defect structure for exemplary embodiment 4 is formed by defect types a, c, d, and e together with their associated time constants $\tau_a$ 131a, $\tau_c$ 131b, $\tau_d$ 121a, and $\tau_e$ 121b, and maximum decreases in barrier height $\delta\phi_a^-$ 132a, $\delta\phi_c^-$ 132b, and $\delta\phi_d^+$ 122a caused by these defect types.

A true activation energy of 0.92 eV with a charge of 1 e results for defect type a. A true activation energy of 0.95 eV with a charge of 3 e results for defect type b. A true activation energy of 0.855 eV with a charge of 4 e results for defect type c. A true activation energy of <0.8 eV with a charge of 1 e results for defect type d. A true activation energy of 1.04 eV with a charge of 2 e results for defect type e. A true activation energy of 1.22 eV with a charge of 2 e results for defect type f. Due to the reduction of the lead content in the sputtered PZT layer of exemplary embodiment 4, it was possible to reduce maximum decreases in barrier height $\delta\phi_b^-$, $\delta\phi_c^-$, and $\delta\phi_f^+$ of defect types b, c, and f associated with lead, in comparison to exemplary embodiment 2. This reduction is denoted by reference numeral 115 by way of example for $\delta\phi_c^-$ 132b. Maximum decreases in barrier height $\delta\phi_b^-$ and $\delta\phi_f^+$ are so small that they are no longer discernibly present due to the numerical fit to the model. Since $\tau_a<\tau_b<\tau_c$ for defect type b, it may be deduced that $\tau_b<\tau_c$ and $\delta\phi_b^-<<\delta\phi_c^-$.

Figure 2D:
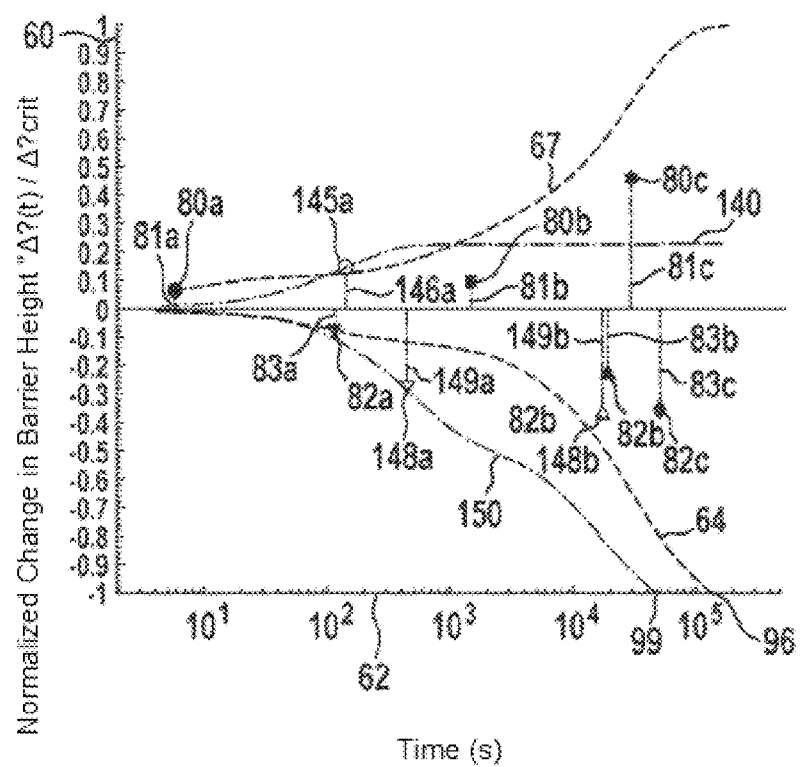
FIG. 2D shows the maximum changes in barrier height and characteristic time constants of two exemplary embodiments for the operating state 175° C./−2.5 V by way of example.

FIG. 2D shows a comparison of the curves of changes in barrier height $\Delta\phi(t)^\pm$ for the two exemplary embodiments 2 and 5 together with their particular characteristic time constants $\tau_i^{+/-}$ and maximum changes in barrier height $\delta\phi_i^{+/-}$ at a main operating temperature of 175° C. and a main operating voltage of −2.5 V. Time is logarithmically plotted on X axis 62 in units of seconds, and the change in barrier height divided by critical change in barrier height $\Delta\phi_{crit}$ of particular exemplary embodiment 2 and 5 is plotted on Y axis 60 without units.

Curve $\Delta\phi(t)^-$ 64 of exemplary embodiment 2 and curve $\Delta\phi(t)^-$ 150 of exemplary embodiment 5 are illustrated. Associated curve $\Delta\phi(t)^+$ 67 of exemplary embodiment 2 and curve $\Delta\phi(t)^+$ 140 of exemplary embodiment 5 are also illustrated. The electrical failure of the dielectric layer of exemplary embodiment 2 takes place at point in time 96, and for exemplary embodiment 5 takes place at point in time 99.

The defect structure for exemplary embodiment 2 is formed by defect types a, b, c, d, e, and f together with their associated time constants $\tau_a$ 82a, $\tau_b$ 82b, $\tau_c$ 82c, $\tau_d$ 80a, $\tau_e$ 80b, and $\tau_f$ 80c, and maximum decreases in barrier height $\delta\phi_a^-$ 83a, $\delta\phi_b^-$ 83b, $\delta\phi_c^-$ 83c, $\delta\phi_d^+$ 81a, $\delta\phi_e^+$ 81b, and $\delta\phi_f^+$ 81c caused by these defect types. The defect structure for exemplary embodiment 5 is formed by defect types a, b, and d together with their associated time constants $\tau_a$ 148a, $\tau_b$ 148b, and $\tau_d$ 145a, and maximum decreases in barrier height $\delta\phi_a^-$ 149a, $\delta\phi_b^-$ 149b, and $\delta\phi_d^+$ 146a caused by these defect types.

A true activation energy of 0.92 eV with a charge of 1 e results for defect type a. A true activation energy of 0.95 eV with a charge of 3 e results for defect type b. A true activation energy of 0.855 eV with a charge of 4 e results for defect type c. A true activation energy of <0.8 eV with a charge of 1 e results for defect type d. A true activation energy of 1.04 eV with a charge of 2 e results for defect type e. A true activation energy of 1.22 eV with a charge of 2 e results for defect type f. Due to the additional nickel content in the sputtered PZT layer of exemplary embodiment 5, it was possible to significantly influence maximum decreases in barrier height $\delta\phi_a^-$ and $\delta\phi_b^-$. In addition, it was possible to reduce maximum decreases in barrier height $\delta\phi_e^+$ and $\delta\phi_f^+$ to the extent that they are no longer discernibly present due to the numerical fit to the model. For the operating conditions 175° C. and −2.5 V, $\tau_a<\tau_b$ and $\delta\phi_a^-<\delta\phi_b^-$ apply for exemplary embodiment 5.

Figure 2E:
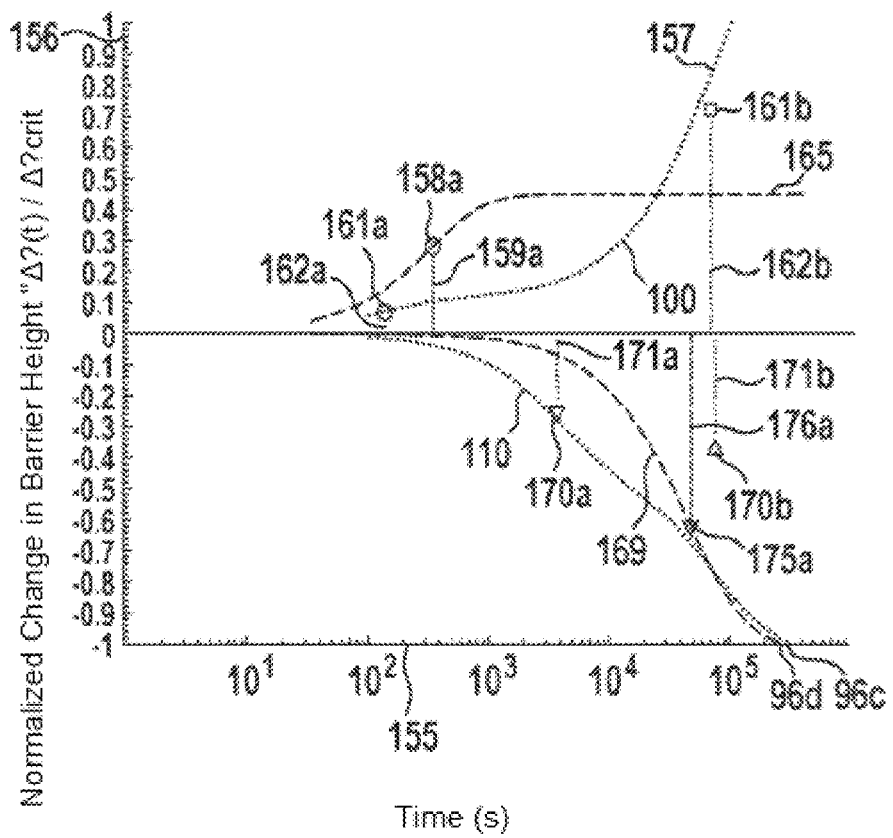
FIG. 2E shows the maximum changes in barrier height and characteristic time constants of two exemplary embodiments for the operating state 100° C./−10 V by way of example.

FIG. 2E shows a comparison of the curves of changes in barrier height $\Delta\phi(t)^\pm$ for the two exemplary embodiments 2 and 5 at a main operating temperature of 100° C. and a main operating voltage of −10 V, together with particular characteristic time constants $\tau_i^{+/-}$ and maximum changes in barrier height $\delta\phi_i^{+/-}$. Time is logarithmically plotted on X axis 155 in units of seconds, and the change in barrier height divided by critical change in barrier height $\Delta\phi_{crit}^-$ of particular exemplary embodiment 2 and 5 is plotted on Y axis 156 without units.

Curve $\Delta\phi(t)^-$ 110 of exemplary embodiment 2 and curve $\Delta\phi(t)^-$ 169 of exemplary embodiment 5 are illustrated. Associated curve $\Delta\phi(t)^+$ 100 of exemplary embodiment 2 and curve $\Delta\phi(t)^+$ 165 of exemplary embodiment 5 are also illustrated. The electrical failure of the dielectric layer of exemplary embodiment 2 takes place at point in time 96c, and for exemplary embodiment 5 takes place at point in time 96d.

The defect structure for exemplary embodiment 2 is formed by active defect types a, b, d, and e together with their associated time constants $\tau_a$ 170a, $\tau_b$ 170b, $\tau_d$ 161a, and $\tau_e$ 161b, and maximum decreases in barrier height $\delta\phi_a^-$ 171a, $\delta\phi_b^-$ 171b, $\delta\phi_d^+$ 162a, and $\delta\phi_e^+$ 162b caused by these defect types.

The defect structure for exemplary embodiment 5 is formed by defect types a and d together with their associated time constants $\tau_a$ 175a and $\tau_d$ 158a, and maximum decreases in barrier height $\delta\phi_a^-$ 176a and $\delta\phi_d^+$ 159a caused by these defect types.

A true activation energy of 0.92 eV with a charge of 1 e results for defect type a. A true activation energy of 0.95 eV with a charge of 3 e results for defect type b. A true activation energy of <0.8 eV with a charge of 1 e results for defect type d. A true activation energy of 1.04 eV with a charge of 2 e results for defect type e. Due to the additional nickel content in the sputtered PZT layer of exemplary embodiment 5, it was possible to significantly influence maximum decrease in barrier height $\delta\phi_a^-$ 176a. In addition, it was possible to reduce maximum decrease in barrier height W to the extent that it is no longer discernibly present due to the numerical fit to the model.

For exemplary embodiment 2, $\tau_a<\tau_b$ and $\delta\phi_a^-<\delta\phi_b^-$, and $\tau_d<\tau_e$ and $\delta\phi_d^+<\delta\phi_e^+$, apply for the operating conditions 100° C. and −10 V.

Figure 3A:
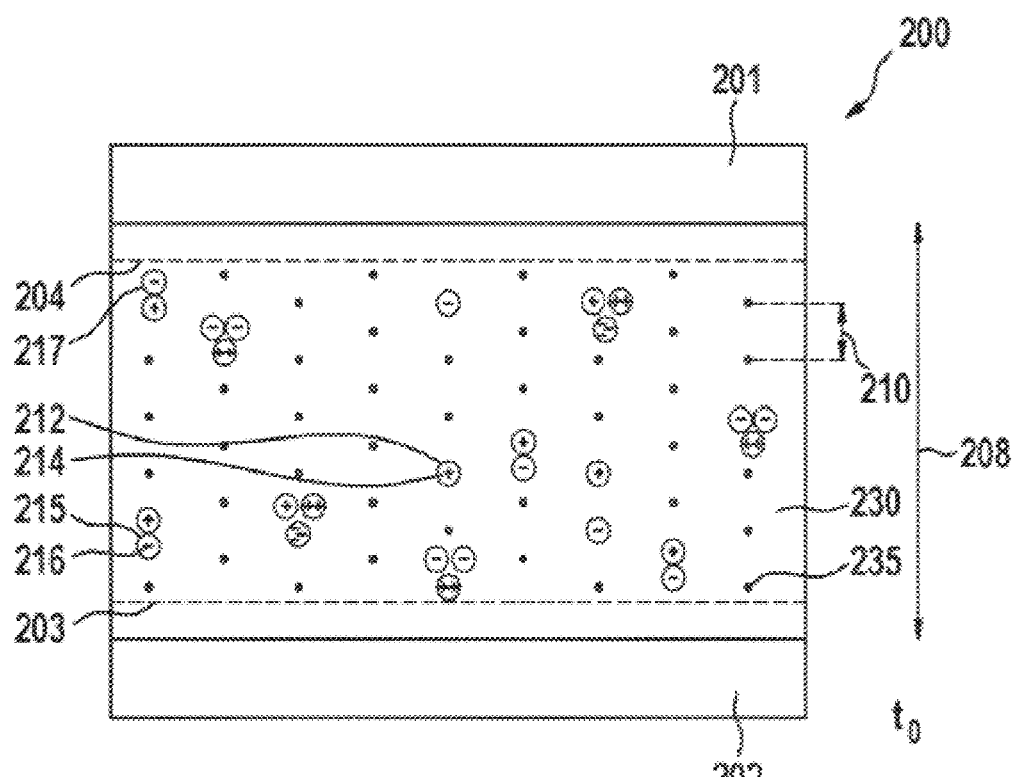
FIGS. 3A through 3D schematically show the movement of different defect types in a dielectric layer along localized defect states, each with an average effective distance $a_0$.

FIG. 3A schematically shows a semiconductor component 200 at a first point in time $t_0$. Semiconductor component 200 includes a dielectric layer 230 having a layer thickness 208. Dielectric layer 230 may be a PZT layer, for example. In addition, semiconductor component 200 includes a first electrode 202 and an electrode 201 that are situated opposite one another. A boundary layer 203 or 204 is also situated between a particular electrode 201 or 202 and dielectric layer 230. Different defect types are present in dielectric layer 230, which are denoted here by way of example as defect type 212 with a single positive charge 214, and defect types 215 and 217 with a single negative charge 216. Indices + and − denote the number of charge carriers of a defect type in question. Defect pairs or defect accumulations are present due to the necessary charge neutrality in dielectric layer 230. This means that when defects with a negative charge 215 and 217 occur, defects with a positive charge 212 also exist in the material. The different defect types 212, 215, and 217 are situated on localized anomalies 235. At first point in time $t_0$ illustrated in FIG. 3A, no voltage between the electrodes 201 and 202, and thus also no electrical field, has yet been applied.

Figure 3B:
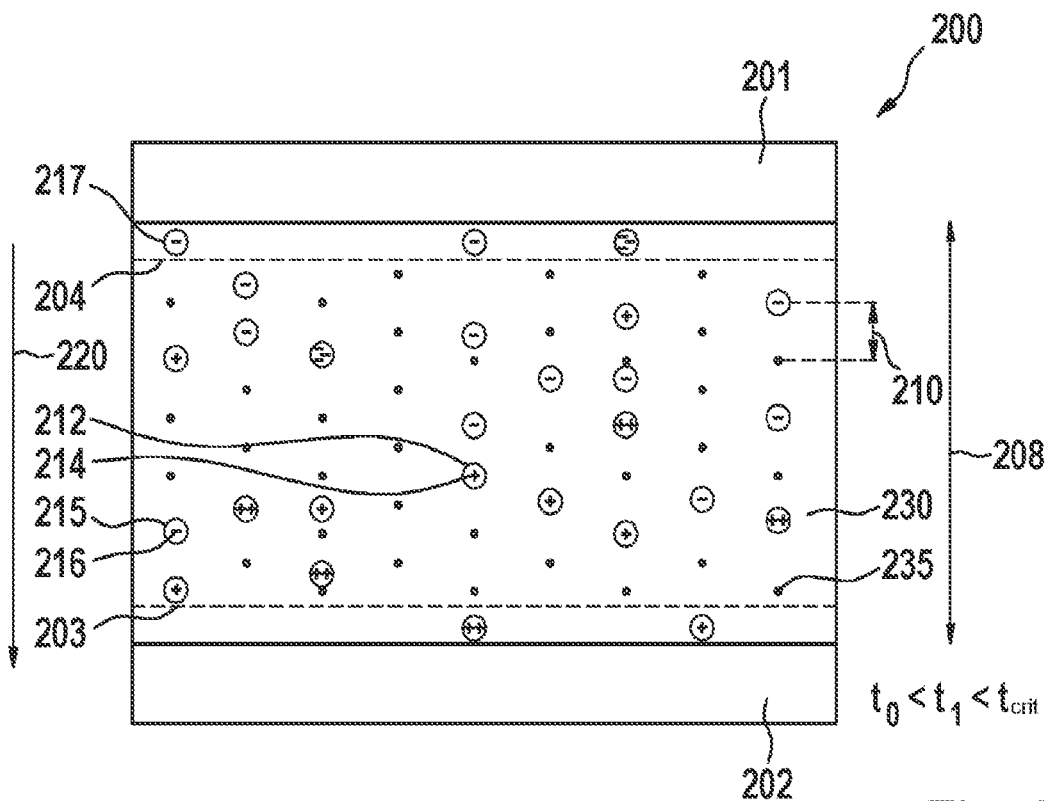

FIG. 3B shows semiconductor component 200 at a second point in time $t_1$ subsequent to first point in time $t_0$. A voltage is applied between first electrode 202 and second electrode 201, and thus an electrical field 220 is generated in the dielectric layer 230, at this point in time $t_1$. The different defect types 212, 215, and 217 now vary as a function of the main operating voltage applied between first electrode 201 and second electrode 202 and a main operating temperature that is present along localized defect states 235. This movement state of defect types 212, 215, and 217 is also referred to as "hopping." Each defect type moves in the direction of a corresponding electrode, at a different velocity. The particular time required by a defect type to reach a particular boundary layer, associated with an electrode after application of the main operating voltage, from the starting position is referred to as characteristic time x. Localized defect states 235 each have same average effective distance $a_0$ 210. Defect types 212 with a positive charge 214 migrate to the electrode having a negative potential (in this case, first electrode 202) and accumulate in boundary layer 203 there. In contrast, defect types 215 and 217 with negative charge 216 move toward the electrode having a positive potential (in this case, second electrode 201) and accumulate in boundary layer 204 there. Charge carriers of leakage current $J_{TED}$, which seek to move from one electrode to the other, must overcome Schottky barriers $\phi(t)$, which are influenced by boundary layers 203 and 204. These barriers have an output barrier height $\phi_0$, and undergo changes in barrier height $\Delta\phi_i$ due to the defect types that accumulate there, which in the further temporal profile result in a maximum change in barrier height $\delta\Phi_i$. The defect types in each case create a different change in barrier height $\Delta\Phi_i$.

Figure 3C:
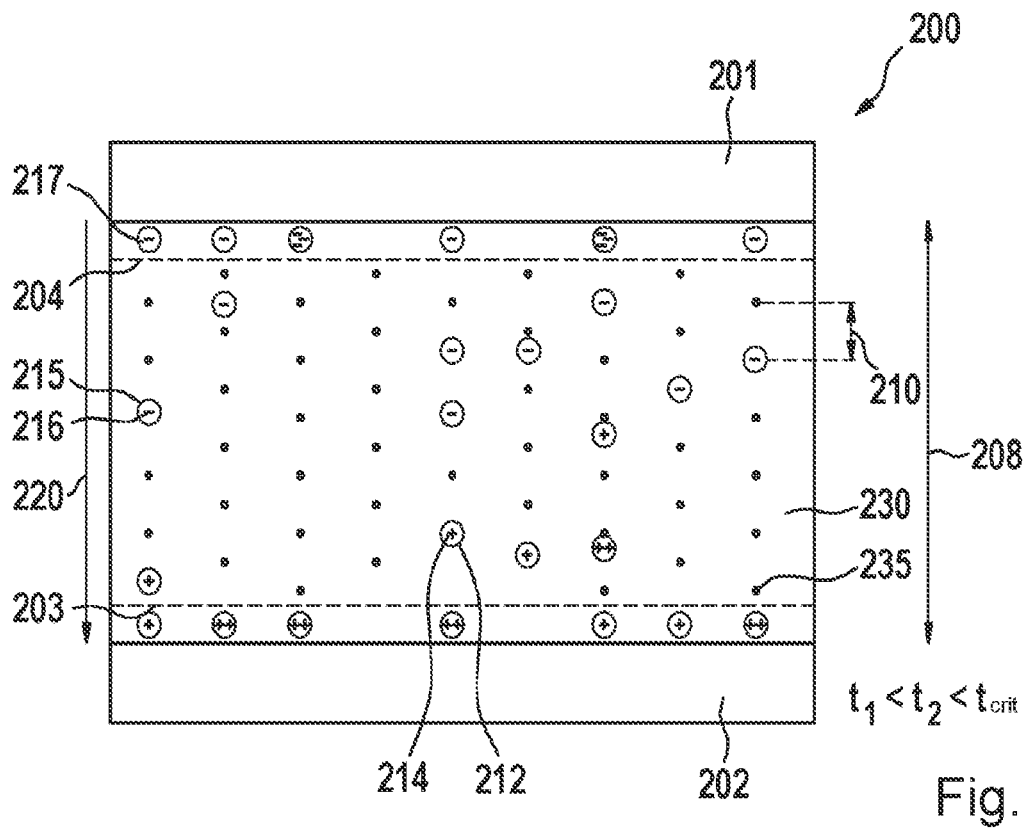
Figure 3D:
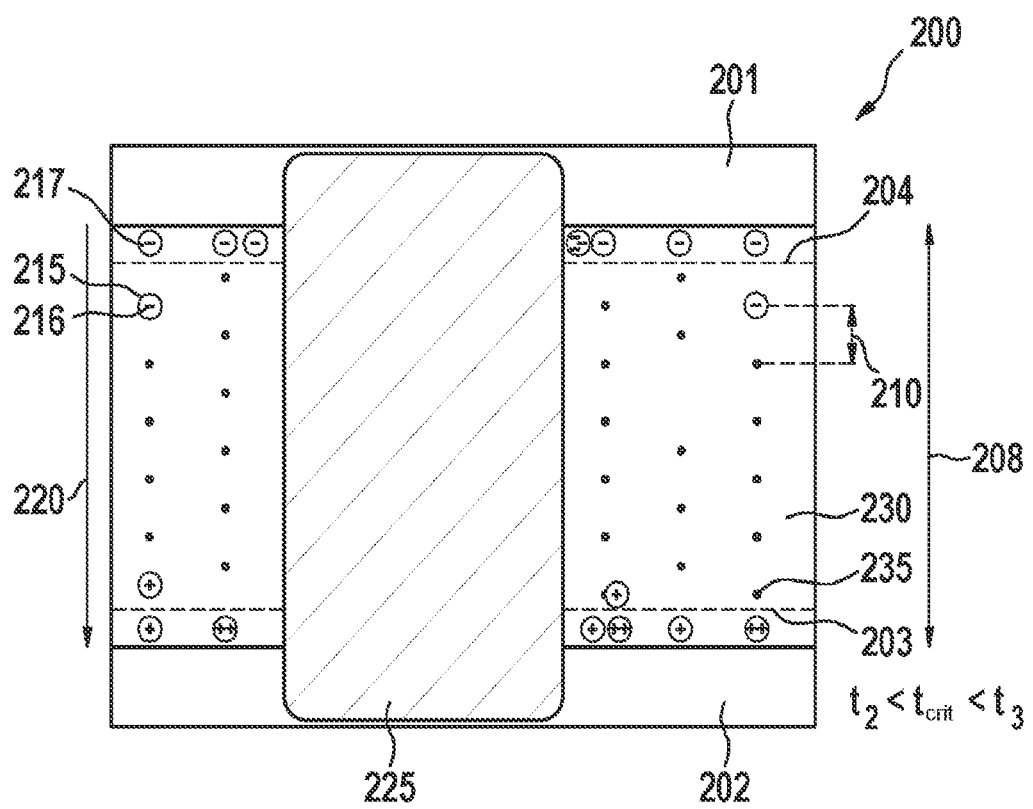

FIG. 3C shows semiconductor component 200 at a third point in time $t_2$ subsequent to second point in time. A plurality of the different defect types 212, 215, and 217 have already accumulated at boundary layers 202 and 203 of dielectric layer 230 and resulted in changes in barrier height $\Delta\phi_i$ there. A critical barrier height $\phi_{crit}$ is reached at one of boundary layers 202 or 203 at a fourth point in time $t_3$ subsequent to the third point in time. As is apparent from FIG. 3D, this now results in a local dielectric breakdown 225 of dielectric layer 230. A semiconductor component 200, which is locally destroyed on a limited surface, remains after $t_{crit}$ is exceeded. This is followed by even further local dielectric breakdowns 225 under continuing load at $t > t_{crit}$, which ultimately results in complete destruction of semiconductor component 200.

What is claimed is:

1. A semiconductor component, comprising:
   at least one dielectric layer; and
   at least one first electrode and at least one second electrode,
   wherein at least one first defect type and at least one second defect type, which is different from the first defect type, are present in the dielectric layer, the at least one first defect type and the at least one second defect type accumulating at one of the first and second electrodes, as a function of a main operating voltage applied between the first electrode and the second electrode, and a main operating temperature that is present at characteristic times $\tau_1$ and $\tau_2$, and generating maximum changes in barrier height $\delta\Phi_1$ and $\delta\Phi_2$ at the first and second electrodes, $\tau_1$ and $\delta\Phi_1$ being associated with the first defect type, and $\tau_2$ and $\delta\Phi_2$ being associated with the second defect type, where $\tau_1 < \tau_2$ and $\delta\Phi_1 < \delta\Phi_2$ apply.

2. The semiconductor component as recited in claim 1, wherein at least one further, third defect type is present in the dielectric layer, the third defect type accumulating at one of the first and second electrodes as a function of the main operating voltage applied between the first electrode and the second electrode, and of the main operating temperature that is present at a characteristic time $\tau_3$, and generating a maximum change in barrier height $\delta\Phi_3$ at the first and second electrodes, where, $\tau_1 < \tau_2 < \tau_3$ applies, a sequence of the change in barrier height differing from a sequence $\delta\Phi_1 > \delta\Phi_2 > \delta\Phi_3$.

3. The semiconductor component as recited in claim 1, wherein the dielectric layer is a polycrystalline oxidic high-k dielectric.

4. The semiconductor component as recited in claim 3, wherein the dielectric layer is a PZT layer or a KNN layer.

5. The semiconductor component as recited in claim 1, wherein the dielectric layer is a sputtered PZT layer.

6. The semiconductor component as recited in claim 5, wherein the sputtered PZT layer has a PZT deposition temperature of less than 500° C.

7. The semiconductor component as recited in claim 5, wherein the sputtered PZT layer has a composition of $Pb_x(Zr_{0.52}Ti_{0.48})O_3$, where $1.2 \leq x \leq 1.3$.

8. The semiconductor component as recited in claim 5, wherein the sputtered PZT layer has a nickel content between 0.1 and 1 atom percent.

* * * * *